(12) United States Patent
Pagani et al.

(10) Patent No.: US 9,728,837 B2
(45) Date of Patent: Aug. 8, 2017

(54) METHOD AND APPARATUS FOR TUNING A RESONANT CIRCUIT USING A LASER

(71) Applicant: STMicroelectronics S.r.l., Agrate Brianza (IT)

(72) Inventors: Alberto Pagani, Nova Milanese (IT); Alessandro Finocchiaro, Catania (IT); Giovanni Girlando, Catania (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 14/817,554

(22) Filed: Aug. 4, 2015

(65) Prior Publication Data
US 2015/0336207 A1  Nov. 26, 2015

Related U.S. Application Data

(62) Division of application No. 13/032,854, filed on Feb. 23, 2011, now Pat. No. 9,112,263.

(30) Foreign Application Priority Data

Feb. 25, 2010 (IT) ............................. TO2010A0140

(51) Int. Cl.
*G08B 21/00* (2006.01)
*H01Q 1/22* (2006.01)
(Continued)

(52) U.S. Cl.
CPC ..... *H01Q 1/2225* (2013.01); *G06K 19/07749* (2013.01); *G06K 19/07775* (2013.01);
(Continued)

(58) Field of Classification Search
CPC ....... G06K 19/07775; G06K 19/07779; H01Q 1/526
See application file for complete search history.

(56) References Cited

U.S. PATENT DOCUMENTS 4,186,350 A   1/1980  Takayama
6,133,834 A  10/2000  Eberth et al.
(Continued)

FOREIGN PATENT DOCUMENTS

EP       1912282 A1   4/2008
WO  WO-2005074402 A2   8/2005
(Continued)

OTHER PUBLICATIONS

Abrial, et al: "A New Contactless Smart Card IC Using an On-Chip Antenna and an Asynchronous Microcontroller," IEEE Journal of Solid-State Circuits, vol. 36, No. 7, Jul. 2001, pp. 1101-1107.
(Continued)

*Primary Examiner* — Mark Rushing
(74) *Attorney, Agent, or Firm* — Gardere Wynne Sewell LLP

(57) ABSTRACT

An electronic communications device includes a body of semiconductor material with an integrated electronic circuit, an inductive element, and a capacitive element. The capacitive element is formed by a first electrode and a second electrode positioned between the inductive element and the integrated electronic circuit. Tuning of the device circuitry is accomplished by energizing the inductive/capacitive elements, determining resonance frequency, and using a laser trimming operation to alter the structure of one or more of the first electrode, second electrode or inductive element and change the resonance frequency.

22 Claims, 10 Drawing Sheets

(51) Int. Cl.

| | | |
|---|---|---|
| *H01L 21/66* | (2006.01) | |
| *H01L 49/02* | (2006.01) | |
| *H01L 23/66* | (2006.01) | |
| *H01L 21/268* | (2006.01) | |
| *H01L 21/67* | (2006.01) | |
| *G06K 19/077* | (2006.01) | |
| *H01Q 1/52* | (2006.01) | |
| *H01L 23/522* | (2006.01) | |

(52) U.S. Cl.
CPC ...... *G06K 19/07779* (2013.01); *H01L 21/268* (2013.01); *H01L 21/67115* (2013.01); *H01L 21/67253* (2013.01); *H01L 22/26* (2013.01); *H01L 22/34* (2013.01); *H01L 23/5223* (2013.01); *H01L 23/5225* (2013.01); *H01L 23/5227* (2013.01); *H01L 23/66* (2013.01); *H01L 28/10* (2013.01); *H01L 28/40* (2013.01); *H01Q 1/526* (2013.01); *H01L 2223/6672* (2013.01); *H01L 2223/6677* (2013.01); *H01L 2924/0002* (2013.01); *Y10T 29/49004* (2015.01)

(56) References Cited

U.S. PATENT DOCUMENTS

| | | |
|---|---|---|
| 6,480,110 B2 | 11/2002 | Lee et al. |
| 6,646,328 B2 | 11/2003 | Tsai |
| 7,113,139 B2 | 9/2006 | Charrat |
| 7,159,785 B2 | 1/2007 | Yamanaka et al. |
| 7,408,517 B1 | 8/2008 | Poilasne et al. |
| 2005/0001785 A1 | 1/2005 | Ferguson et al. |
| 2005/0179552 A1 | 8/2005 | Shoji et al. |
| 2005/0210978 A1 | 9/2005 | Lang et al. |
| 2006/0097048 A1 | 5/2006 | Mori |
| 2006/0289640 A1 | 12/2006 | Mercure et al. |
| 2007/0090926 A1 | 4/2007 | Potyrailo et al. |
| 2007/0090955 A1 | 4/2007 | Cote et al. |
| 2007/0164414 A1 | 7/2007 | Dokai et al. |
| 2007/0268113 A1 | 11/2007 | Johnson |
| 2007/0273532 A1 | 11/2007 | Martin |
| 2008/0079550 A1 | 4/2008 | Briggs et al. |
| 2008/0081581 A1 | 4/2008 | Rofougaran |
| 2008/0129623 A1 | 6/2008 | Barry |
| 2008/0314715 A1* | 12/2008 | Wolters ............ G06K 19/0672 194/302 |
| 2009/0278690 A1 | 11/2009 | Degani |
| 2011/0036912 A1 | 2/2011 | Guo et al. |
| 2012/0286902 A1* | 11/2012 | Michalk ........... G06K 19/07749 333/219 |

FOREIGN PATENT DOCUMENTS

| | | |
|---|---|---|
| WO | WO-2007086809 A1 | 8/2007 |
| WO | WO-2009010294 A1 | 1/2009 |

OTHER PUBLICATIONS

Aguilera, et al: "Design and Test of Integrated Inductors for RF Applications," 2003, Kluver Academic Publisher, Boston, pp. 53-61.

EPO Search Report for EP11155905 dated May 26, 2011 (4 pages).

Finocchiaro, et al: "A 900-MHz RFID System with TAG-Antenna Magnetically-Coupled to the Die," 2008 IEEE Radio Frequency Integrated Circuits Symposium, pp. 281-284.

Guo, et al: "Design and Manufacturing of Small Area On-Chip-Antenna (OCA) for RFID Tags," 2006 IEEE, pp. 198-201.

IT Search Report for IT TO2010A000140 dated Oct. 22, 2010 (2 pages).

* cited by examiner

METHOD AND APPARATUS FOR TUNING A RESONANT CIRCUIT USING A LASER

CROSS-REFERENCE TO RELATED APPLICATIONS

This application is a divisional application from U.S. application patent Ser. No. 13/032,854 filed Feb. 23, 2011, now U.S. Pat. No. 9,112,263, which claims priority to Italian Patent Application No. TO2010A000140, filed Feb. 25, 2010, which applications are incorporated herein by reference in their entireties.

TECHNICAL FIELD

An embodiment relates to an electronic communications device with antenna and electromagnetic shield.

BACKGROUND

As is known, numerous electronic communications devices are today available, which are able to communicate with other electronic devices by means of techniques of coupling of an inductive or electromagnetic type. In particular, these electronic communications devices are provided with a transmitter circuit and at least one antenna coupled to the transmitter circuit. The transmitter circuit is able to drive the antenna in such a way that it generates an electromagnetic field having at least one electrical characteristic (for example, the amplitude, frequency, or phase) modulated with information to be transmitted. Consequently, other electronic devices that receive this electromagnetic field may demodulate the information transmitted.

Considering a generic electronic transmitter device, which generates a given electromagnetic field at least one operating frequency, and a generic electronic receiver device, which is set at a distance h from the transmitter device and receives the given electromagnetic field, between the electronic transmitter device and the electronic receiver device a communications channel is set up, which may also be obtained via a coupling of a magnetic type. In practice, in the case of magnetic or inductive coupling, the information is transmitted principally thanks to a magnetic field generated by the antenna of the electronic transmitter device, whereas in the case of electromagnetic transmission, the information is transmitted through the propagation of electromagnetic waves generated by the antenna. Consequently, in the case of magnetic or inductive coupling, it is common to use a single or multiple loop antenna, and in this case the electrical behavior of the antenna is equivalent to that of an inductor. In greater detail, in the case of inductive coupling, the antenna can be equated, to a first approximation, to a reactive element, whereas in the case of electromagnetic transmission, the antenna can be equated, to a first approximation, to a resistive element.

In the present document, reference is made to antennas in general, implying the possibility that, in given conditions (and hence, in given applications), these are equivalent, from a circuit standpoint and to a first approximation, to corresponding inductors.

Once again with reference to electronic communications devices, the antennas considered herein may be of a different type, such as for example patch antennas or gain loop antennas, the latter being also known as "magnetic-dipole antennas" and finding particular use in the field of radio-frequency-identification (RFID) applications. For example, in the case of loop antennas, it may be possible for them to be arranged, within the respective electronic communications devices, in such a way that, in top plan view, they surround, or else are set on top of, the corresponding transmitter circuits. In general, it may in any case be possible that, given an electronic communications device, the respective antenna interferes, in use, with the respective transmitter circuit. In order to reduce the interference, there are known electronic communications devices of the type illustrated in FIG. 1.

In detail, the electronic communications device shown in FIG. 1, which for convenience in what follows will be referred to as "device 1", comprises: a body of semiconductor material 2, which defines a first top surface 2a and in turn comprises a substrate of semiconductor material possibly set on top of which are one or more epitaxial layers (not shown); a top region 4, which extends on the first top surface 2a of the body of semiconductor material 2, and defines a second top surface 4a; a metal shield 6, which extends on the second top surface 4a; a silicon-oxide layer 8, which extends on the metal shield 6; a plurality of metal turns 10, for example of a circular or polygonal shape, which are coplanar and concentric, extend above, and in contact with, the silicon-oxide layer 8 and form, as a whole, an antenna 12; and a possible protective layer 14, which extends on the silicon-oxide layer 18, and extending within which are the aforementioned metal turns 10.

Yet in greater detail, formed within the body of semiconductor material 2 is an electronic circuit. In addition, the top region 4 may comprise dielectric layers and conductive paths formed by metallizations and vias, which are generally coupled to the body of semiconductor material 2 so as to enable connection of the electronic circuit with the antenna 12, as described below. In particular, in FIG. 1 the metallizations are shown in a qualitative way and are designated by 16. In addition, a first metallization and a second metallization, which are designated, respectively, by 16a and 16b, are coupled to the metal shield 6, respectively, by means of a first vertical metal connection 18a and a second vertical metal connection 18b. In particular, as illustrated qualitatively in FIG. 1, the metal shield 6 may be of a planar type, but may have different shapes, such as, for example, shapes known as "cross-bar pattern", "halo-ground contact", "narrow-bar pattern", "wide-bar pattern", "solid-ground pattern", "perforated-ground pattern", and illustrated in FIGS. 2a-2f, respectively.

Finally, as regards in particular the antenna 12, the metal turns 10 that form it may have different widths, but are in any case in ohmic contact with one another, as shown by way of example in FIG. 3, in such a way that it is possible to define a start terminal 20a and an end terminal 20b of the antenna 12. These start and end terminals 20a, 20b are coupled, respectively, by means of a first metal via 22a and a second metal via 22b, to the metal shield 6. In particular, the first and second metal vias 22a, 22b contact the metal shield 6 at points corresponding, respectively, to the points in which the first and second vertical metal connections 18a, 18b contact in turn the metal shield 6.

From a circuit standpoint, the metal shield 6 may be floating or else coupled to ground. In either case, its function is that of limiting any mutual interference between the antenna 12 and the electronic circuit formed in the body of semiconductor material 2. In addition, the shape assumed by the metal shield 6 may be optimized for limiting, in use, onset of loop currents within the metal shield 6 itself, which in turn could interfere with the behavior of the antenna 12. Further known variants envisage use, in lieu of the metal shield 6, of a polysilicon shield in order to prevent undesirable reflections of the electromagnetic field generated by the antenna 12.

As regards, instead, the first and second metal vias 22a, 22b, as well as the silicon-oxide layer 8 and the possible protective layer 14, they may be designed so as to match the impedance of the antenna 12 with the impedance of the electronic circuit.

In general, the antennas present in electronic communications devices of a known type may be, amongst other things, antennas of a so-called LC type, i.e., formed (from an equivalent-circuit standpoint) by an inductor coupled, either in series or in parallel, to a corresponding capacitor. In this way, the behavior of each antenna may be optimized, in particular as regards the conditions of inductive coupling (also known as resonance conditions), for a respective resonance frequency f, which depends upon the inductance associated with the inductor and the capacitance of the capacitor to which the inductor is coupled, according to the relation $LC\omega^2=1$, where $\omega=2\pi f$.

In the present electronic communications devices, there hence arises the problem of obtaining these capacitors with sufficient precision and of connecting them to the respective antennas. In particular, electronic communications devices of the type shown in WO2007/086809, which is incorporated by reference, are known, in which the capacitors, and in particular the electrodes of the capacitors themselves, are arranged underneath the respective metal shields. In particular, these capacitors are integrated in the electronic communications devices, either within the respective bodies of semiconductor material or else within the respective top regions. In either case, this entails an increase of the overall dimensions of the electronic communications devices, and in particular of the area of the electronic communications devices.

SUMMARY

An embodiment is an electronic communications device with antenna and electromagnetic shield, which will enable the drawbacks of the known art to be at least partially overcome.

In an embodiment, a system for tuning a resonant circuit comprised of an inductive circuit portion and a capacitive circuit portion comprises: a transparent substrate; a test antenna supported by the transparent substrate; an automated test equipment circuit coupled to the test antenna and configured to apply a variable signal to said test antenna for communication to said resonant circuit to identify a resonant frequency of said resonant circuit; and a trimming laser configured to emitting a laser beam through said transparent substrate to effectuate a trimming of a structure of at least one of the inductive circuit portion and the capacitive circuit portion for adjusting the resonant frequency.

In an embodiment, a method comprises: energizing a resonant circuit comprised of an inductive circuit portion and a capacitive circuit portion; identifying a resonant frequency of said resonant circuit from said energizing; and emitting a laser beam to effectuate a trimming of a structure of at least one of the inductive circuit portion and the capacitive circuit portion for adjusting the resonant frequency.

BRIEF DESCRIPTION OF THE DRAWINGS

One or more embodiments are now described, purely by way of non-limiting example and with reference to the attached drawings, wherein.

DETAILED DESCRIPTION

Figure 1:
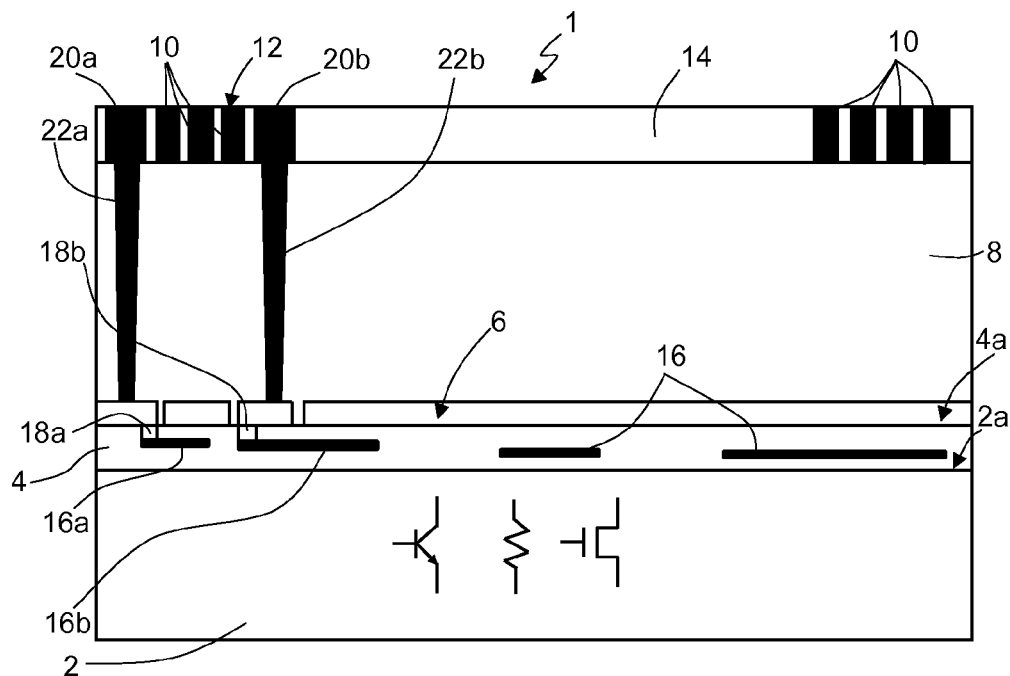
FIG. 1 shows a cross section of an electronic communications device of a known type.
Figure 2A:
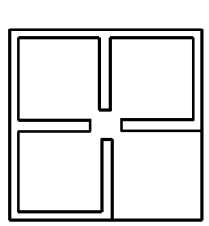
FIGS. 2a-2f show top plan views of examples of electromagnetic shields of a known type.
Figure 2B:
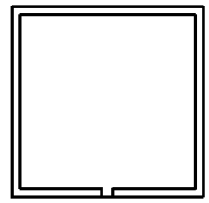
Figure 2C:
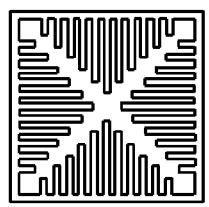
Figure 2D:
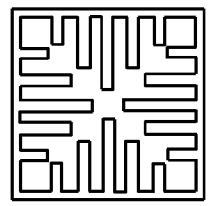
Figure 2E:
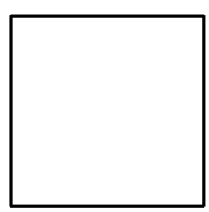
Figure 2F:
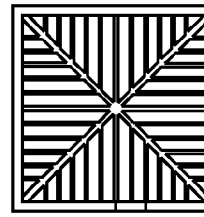
Figure 3:
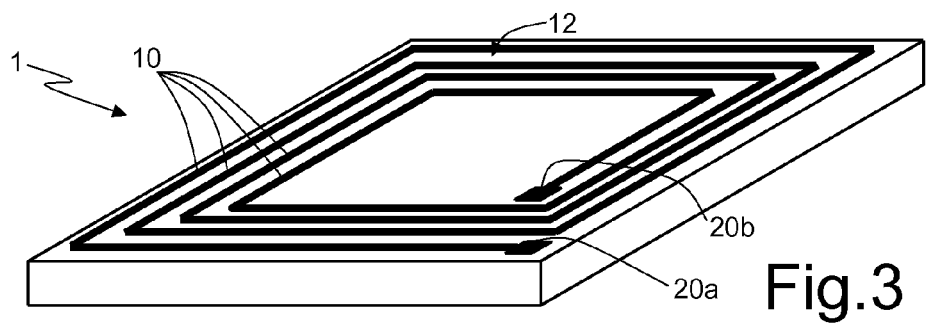
FIG. 3 shows a perspective view of the electronic communications device shown in FIG. 1.
Figure 4:
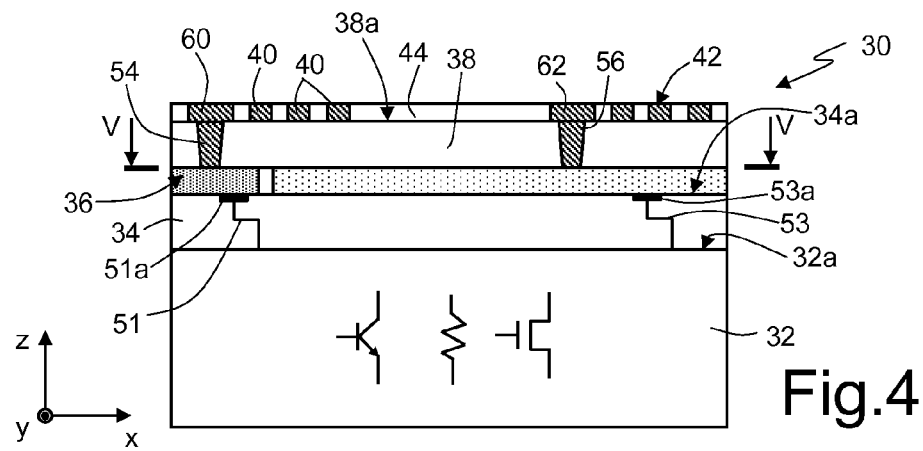
FIGS. 4 and 8 show cross sections of embodiments of an electronic device.

FIG. 4 shows an embodiment of an electronic communications device, which is designated by 30 and which will be referred to in what follows, for reasons of simplicity, as "communications device 30".

In detail, the communications device 30 comprises: a body of semiconductor material 32, which defines a first top surface 32a and comprises in turn a substrate of semiconductor material (not shown) possibly set on top of which are one or more epitaxial layers (not shown); a top region 34, which extends on the first top surface 32a and defines a second top surface 34a; an electromagnetic shield 36, which extends on the second top surface 34a; a dielectric layer 38 (for example, made of silicon oxide), which extends on the electromagnetic shield 36 and defines a third top surface 38a; a plurality of metal turns 40, which may be, for example, of a circular or polygonal shape, and which are coplanar and concentric, extend above and in contact with the dielectric layer 38, and form, as a whole, an antenna 42; and a possible protective layer 44, which extends on the dielectric layer 38, and extending within which are the aforementioned metal turns 40. Alternatively, the metal turns 40 of the antenna 42 may be formed within the dielectric layer 38, for example in contact with the top surface 38a (case not shown) in such a way that the protective layer 44 protects the antenna 42.

In still greater detail, formed within the body of semiconductor material 32 is at least one electronic circuit. In addition, the top region 34 may comprise dielectric layers and conductive paths formed by metallizations and vias, these conductive paths being generally coupled to the body of semiconductor material 32 so as to enable connection of the electronic circuit with the antenna 42, as described hereinafter.

Figure 5:
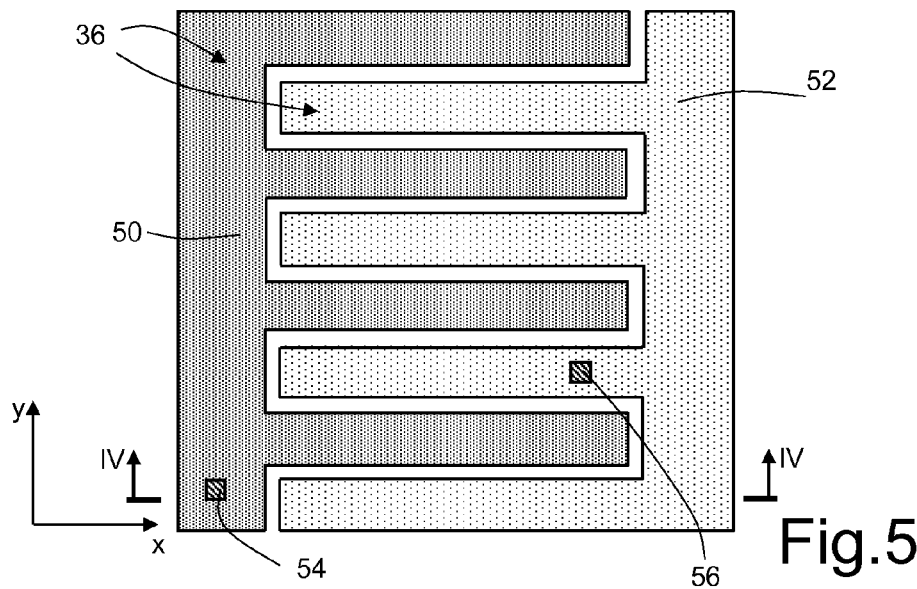
FIG. 5 shows a cross section of the embodiment shown in FIG. 4.

In particular, set between the electronic circuit and the antenna 42 is hence the electromagnetic shield 36, which, in the embodiment illustrated, comprises a first electrode 50 and a second electrode 52, coplanar and comb-fingered to one another, hence not in ohmic contact, as shown in FIG. 5. In practice, the first and second electrodes 50, 52, and hence the electromagnetic shield 36 itself, form a capacitor C.

Both the first electrode 50 and the second electrode 52 are coupled to the electronic circuit present in the body of semiconductor material 32, respectively, through at least one first metal connection 51 and a second metal connection 53, which extend in the top region 34 and may comprise dielectric layers and metallizations. In particular, both the first metal connection 51 and the second metal connection 53 may comprise pads 51a, 53a, in direct contact with the first electrode 50 and the second electrode 52, respectively.

Furthermore, both the first electrode 50 and the second electrode 52 are coupled to the antenna 42 by means of a first metal via 54 and a second metal via 56, respectively, which extend through the dielectric layer 38. In particular, the first metal via 54 is in ohmic contact with the first electrode 50 and with a first point of contact 60 of the antenna 42, while the second metal via 56 is in ohmic contact with the second electrode 52 and a second point of contact 62 of the antenna 42, for example, at a maximum distance from the first point of contact 60, where this distance is measured along the metal turns 40 of the antenna 42 itself. In other words, in the example shown, the first and second points of contact 60, 62 coincide with the terminals of the antenna 42. In addition, the capacitor C is set in parallel with respect to the antenna 42.

Figure 6:
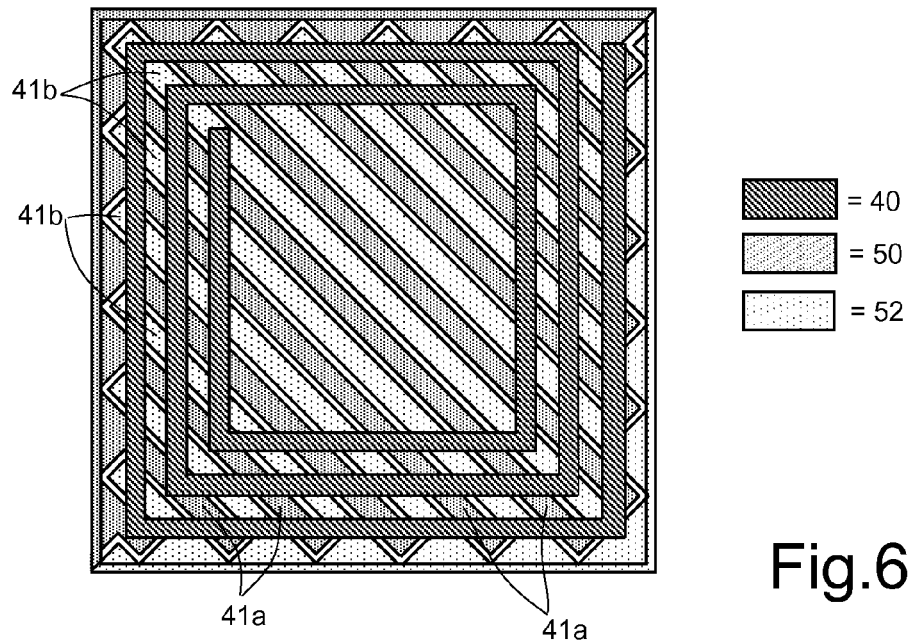
FIG. 6 shows a top plan view with portions removed of an embodiment of an electronic device.

As shown in FIG. 6, the first and second electrodes 50, 52 may have shapes different from the ones previously shown. In particular, if we define a reference system x, y, z fixed with respect to the communications device 30, and with the electromagnetic shield 36 lying parallel to the plane xy, the first and second electrodes 50, 52 may have comb-fingered shapes comprising, respectively, first and second elongated portions 41a and 41b, parallel to one another and inclined, for example by forty-five degrees, with respect to the plane xz or yz. Further and yet other geometrical shapes are in any case possible for the first and second electrodes 50, 52.

Figure 7A:
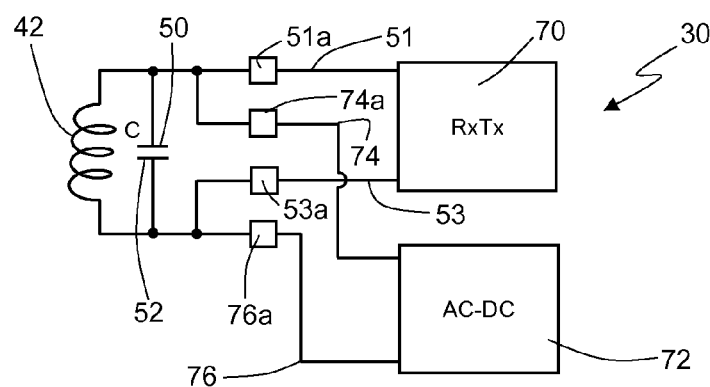
FIGS. 7a and 7b show equivalent circuit diagrams of embodiments of an electronic device.

The capacitor C, and hence the first and second electrodes 50, 52, are coupled to the electronic circuit formed within the body of semiconductor material 32. As shown by way of example in FIG. 7a, this electronic circuit may comprise a number of sub-circuits, such as, for example, a transceiver circuit 70 and a converter circuit 72 of an AC/DC type. In this case, once again by way of example, the transceiver circuit 70 may be coupled to the first and second electrodes 50, 52, respectively, through the first and second metal connections 51, 53, as well as through the first and second pads 51a, 53a. Likewise, the converter circuit 72 may be coupled to the first and second electrodes 50, 52, respectively, through a third metal connection 74 and a fourth metal connection 76, which may comprise, respectively, a third pad 74a and a fourth pad 76a, in direct contact with the first and second electrodes 50, 52, respectively.

Figure 7B:
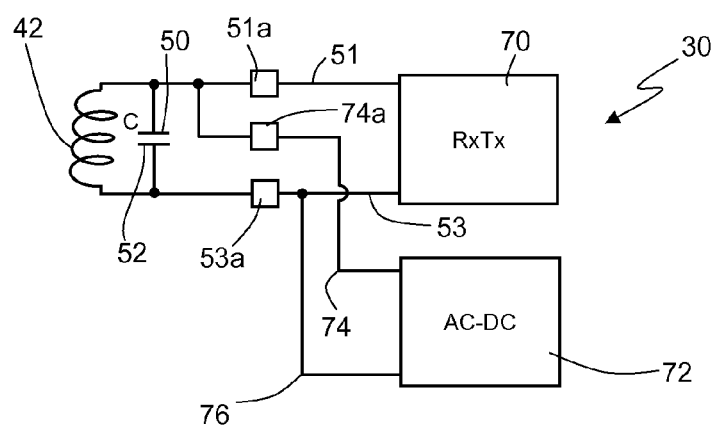

Alternatively, as shown by way of example in FIG. 7b, the fourth metal connection 76 may share the second pad 53a with the second metal connection 53. In either case, it may be possible, for example prior to forming the antenna 42 and the capacitor C, to contact the first, second, third, and possibly fourth pads 51a, 53a, 74a, 76a, for example with the terminals of probes coupled to an automatic measurement system. By means of this automatic measurement system, it may hence be possible to test the electronic circuit easily; in particular, it may be possible to carry out independently the test on possible sub-circuits of the electronic circuit, such as, for example, the transceiver circuit 70 and the converter circuit 72.

Figure 8:
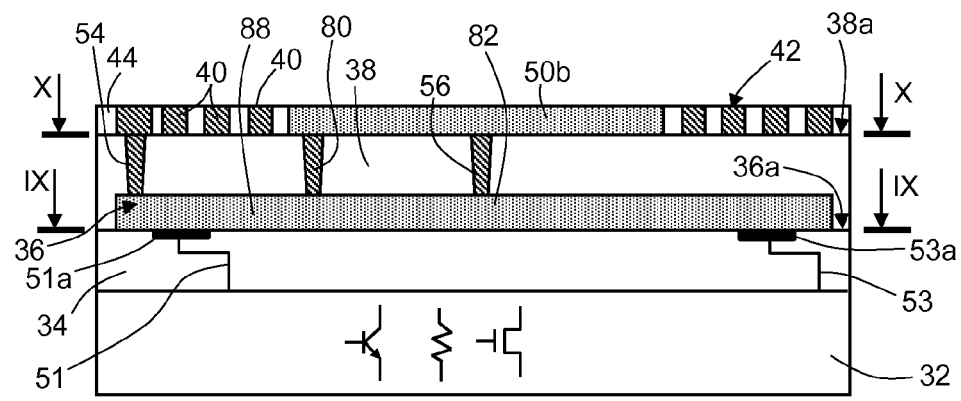
Figure 9:
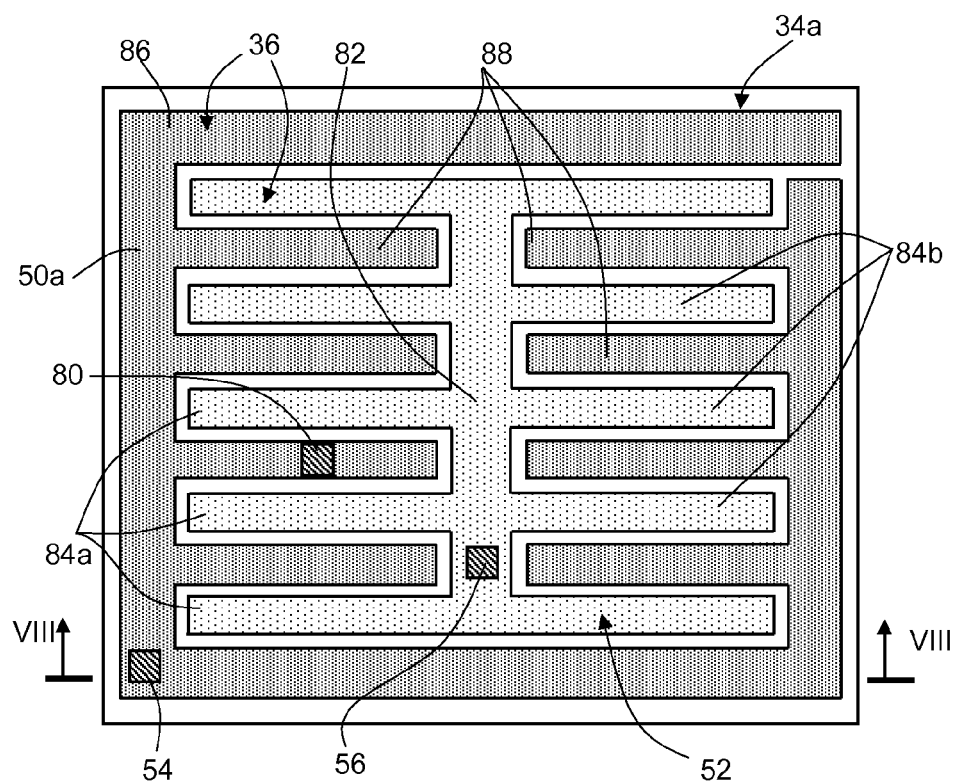
FIGS. 9 and 10 show cross sections of the embodiment shown in FIG. 8.
Figure 10:
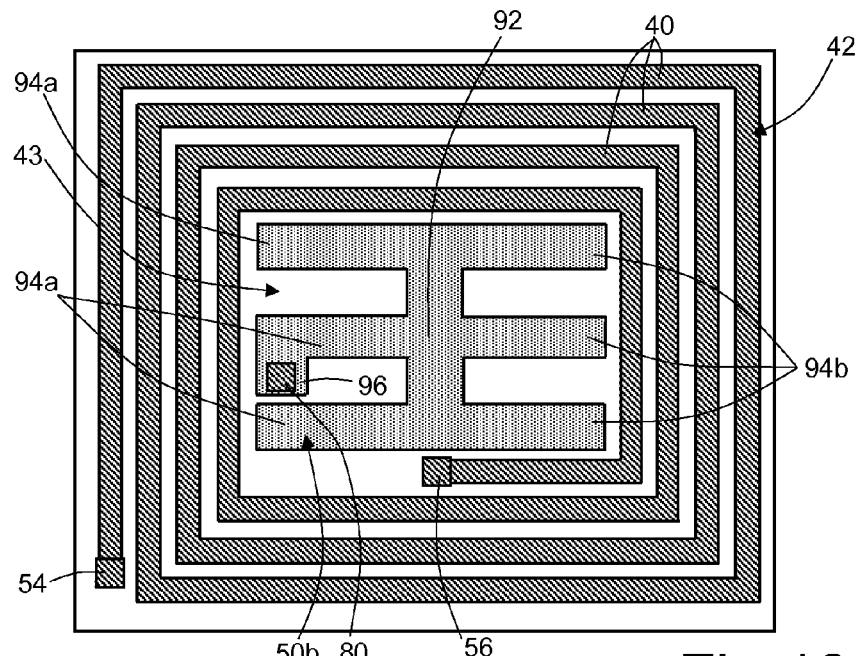

According to another embodiment, illustrated in FIGS. 8-10, one between the first and second electrodes 50, 52 of the capacitor C extends beyond the electromagnetic shield 36. In particular, in FIG. 8, the first electrode 50 is formed by a first portion 50a and a second portion 50b. As shown in FIG. 9, the first portion 50a is coplanar to the second electrode 52, from which it is ohmically uncoupled, and forms with the second electrode 52 the electromagnetic shield 36. Instead, as shown in FIG. 10, the second portion 50b may be set coplanar with respect to the antenna 42, and may be set, for example, within an internal portion 43 defined by the metal turns 40. For example, the second portion 50b may extend above the third top surface 38a, possibly within the protective layer 44.

In greater detail, the first and second portions 50a, 50b are set in ohmic contact with one another in order to form the first electrode 50. The ohmic contact may be provided by coupling the first and second portions 50a, 50b by means of a third metal via 80, which extends through the dielectric layer 38.

Purely by way of example, in the embodiment shown in FIGS. 8-10, the second electrode 52 has an elongated element 82, departing from which, in a direction orthogonal to the elongated element 82 itself, are a first plurality and a second plurality of horizontal elements, which are designated, respectively, by 84a and 84b and are in ohmic contact with the elongated element 82. The first and second horizontal elements 84a, 84b extend, respectively, on opposite sides with respect to the elongated element 82 and in such a way that each first horizontal element 84a is in ohmic contact with, and is specular to, a corresponding second horizontal element 84b, with respect to the elongated element 82. Between pairs of first contiguous horizontal elements 84a and pairs of second contiguous horizontal elements 84b, respective gaps are present.

The first portion 50a of the first electrode 50 surrounds the second electrode 52 and has a complementary shape so as to be comb-fingered with the second electrode 52. In particular, the first portion comprises a metal path 86, for example of a rectangular shape (to a first approximation), which surrounds the second electrode 52 and departing from which are third horizontal elements 88, ohmically coupled to the metal path 86 and arranged within the gaps defined by the second electrode 52. The rectangular metal path 86 is open in order to prevent onset of parasitic currents in the turn that would be created if the rectangular metal path 86 were closed.

As regards, instead, the second portion 50b of the first electrode 50, it may have, for example, a shape similar to that of the second electrode 52, except as regards the proportions. In particular, if we designate by 92, 94a and 94b, respectively, the elongated element and the first and second pluralities of horizontal elements of the second portion 50b, one between the horizontal elements 94a may present, at its own end not coupled to the elongated element 92, a radiusing portion 96, which departs from the end parallel to the elongated element 92 and contacts the third metal via 80.

In practice, in this embodiment, the second portion 50b contacts the first portion 50a through the third metal via 80, and the first portion 50a contacts in turn the antenna 42 through the first metal via 54.

Likewise possible are embodiments (not shown) in which both the first electrode 50 and the second electrode 52 of the capacitor C extend beyond the electromagnetic shield 36 and comprise respective portions coplanar to the antenna 42. These coplanar portions may be arranged within the internal portion 43 defined by the metal turns 40 and may moreover form a further comb-fingered capacitor.

Figure 11:
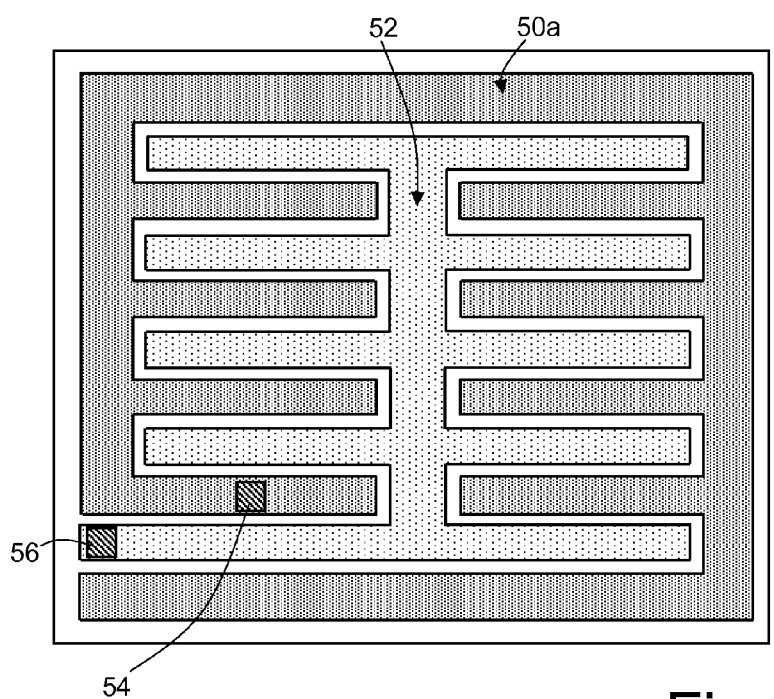
FIGS. 11 and 12 show cross sections of a different embodiment of an electronic device.
Figure 12:
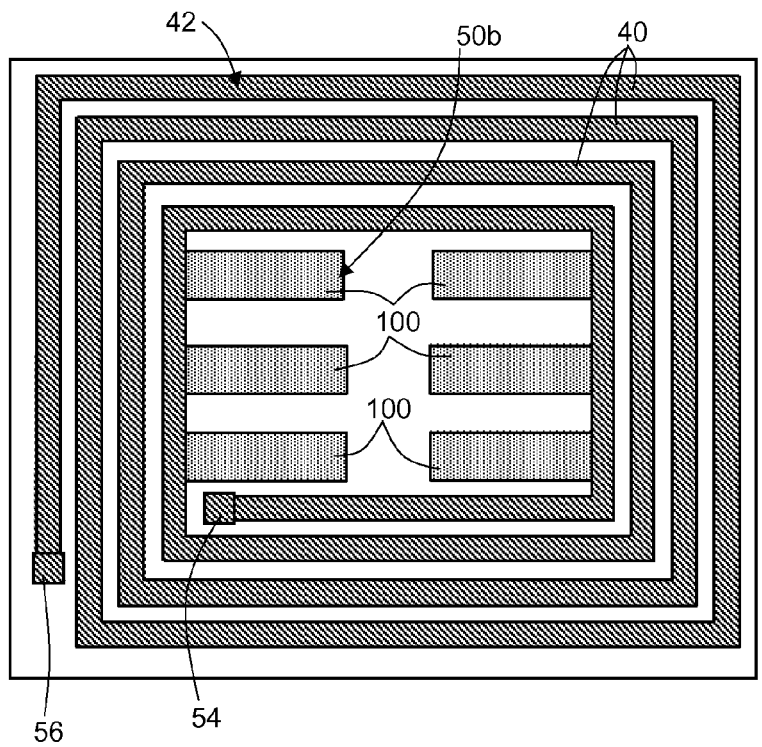

Likewise possible are embodiments of the type illustrated in FIGS. 11 and 12, in which the aforementioned third metal via 80 is not present. In particular, the second portion 50b is in direct contact with the antenna 42, i.e., without interposition of any metal via. In detail, the second portion 50b is in direct contact with the innermost metal turn of the antenna 42. In practice, in this embodiment, the second portion 50b is formed by a plurality of conductive elements 100, each of which is ohmically coupled to a corresponding point of the aforementioned innermost metal turn. Given that it is in ohmic contact with the antenna 42, and since the first metal via 54 is coupled, not only to the antenna 42, but also to the first portion 50a, the first and second portions 50a, 50b define once again the first electrode 50. Again, the first portion 50a has a shape such as to prevent formation of closed loops, inside which parasitic currents may flow.

Figure 13A:
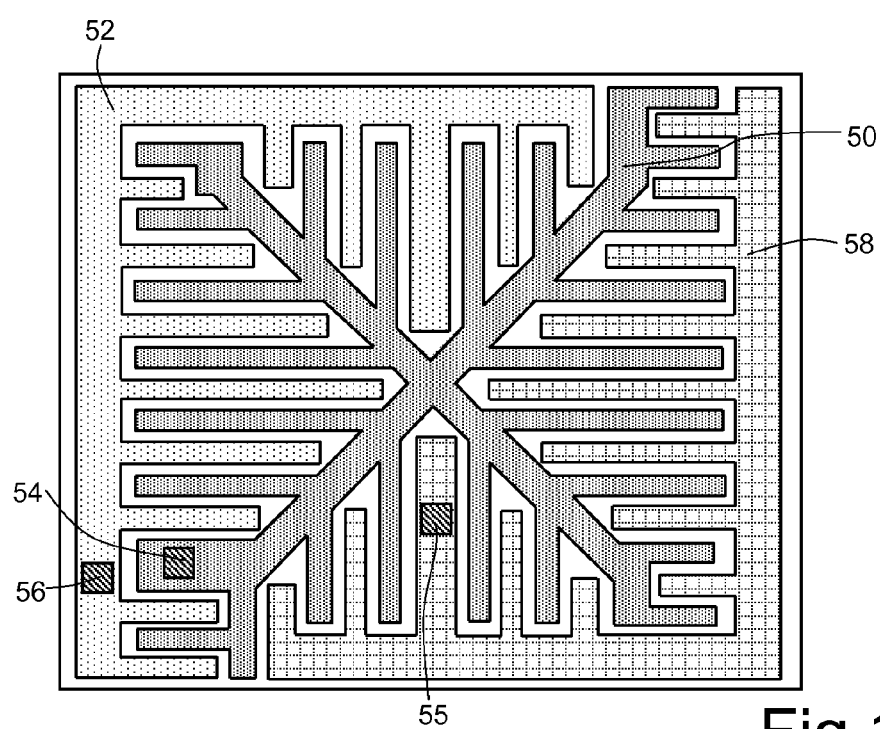
FIGS. 13a and 13b show cross sections of a further embodiment of an electronic device.
Figure 13B:
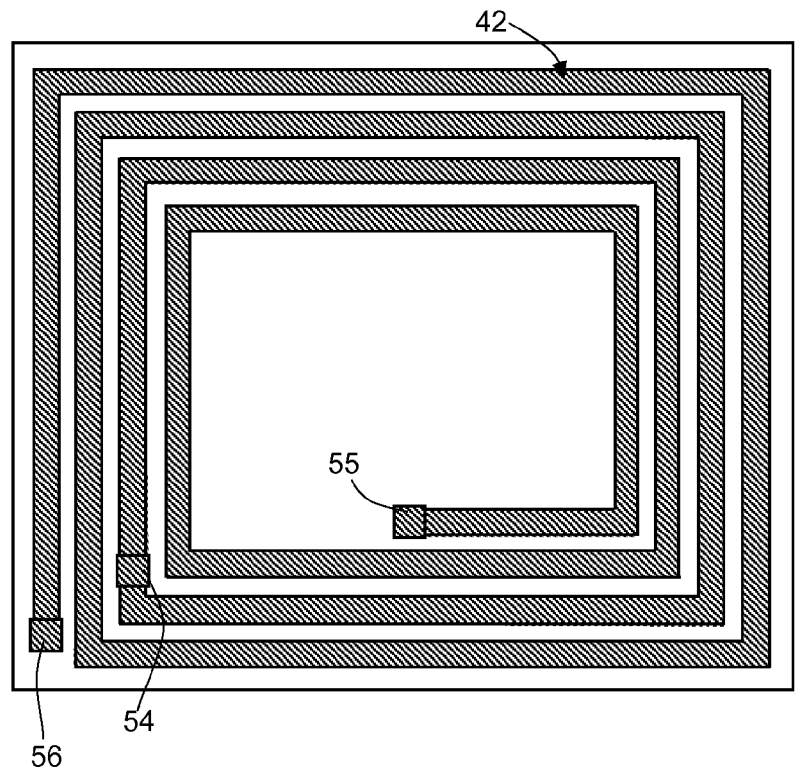

As shown in FIGS. 13a-13b, it is likewise possible for the electromagnetic shield 36 to comprise further electrodes, such as, for example, a third electrode 58. As shown in FIG. 13a, the first, second, and third electrodes 50, 52, 58 may be coplanar and form a comb-fingered structure, in which the third electrode 58 is ohmically uncoupled from the first and second electrodes 50, 52, and the first electrode 50 is surrounded at least in part by the second and third electrodes 52, 58.

In this case, the first, second, and third electrodes 50, 52, 58 may be coupled, respectively, to a reference potential GND, to a first potential V1, and to a second potential V2. In addition, the third electrode 58 may be coupled to the antenna 42. In particular, the third electrode 58 may be ohmically coupled to the antenna 42 through a third-electrode via 55. In this embodiment, the first metal via 54 contacts (in addition to the first electrode 50) the antenna 42 in a point comprised, for example, between the points of the antenna 42 of contact, respectively, with the second metal via 56 and with the third-electrode via 55.

As shown by way of example in FIG. 13b (where in this embodiment the first electrode 50 is without the second portion 50b), these points of the antenna 42 of contact, respectively, with the second metal via 56 and with the third-electrode via 55 may coincide with the terminals of the antenna 42 itself, and the point in which the first metal via 54 contacts the antenna 42 may be equidistant with respect to the terminals of the antenna 42, measuring the distances along the metal turns 40. In these conditions, the equivalent electrical circuit of the antenna 42 and of the electromagnetic shield 36 is the one shown in FIG. 13c. It is, however, also possible that, in this embodiment, the first metal via 54 is absent.

Figure 13C:
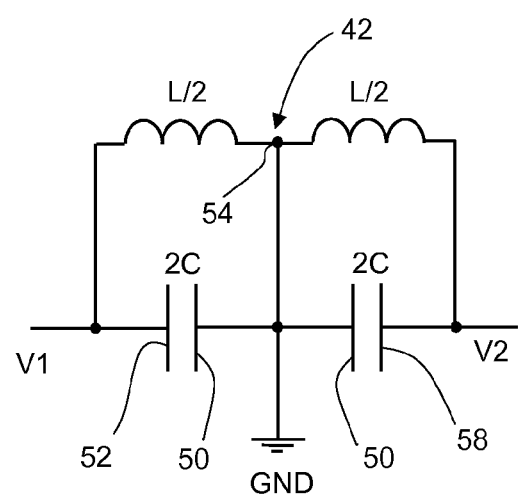
FIG. 13c shows an equivalent electrical circuit of the embodiment the cross sections of which are shown in FIGS. 13a and 13b.
Figure 13D:
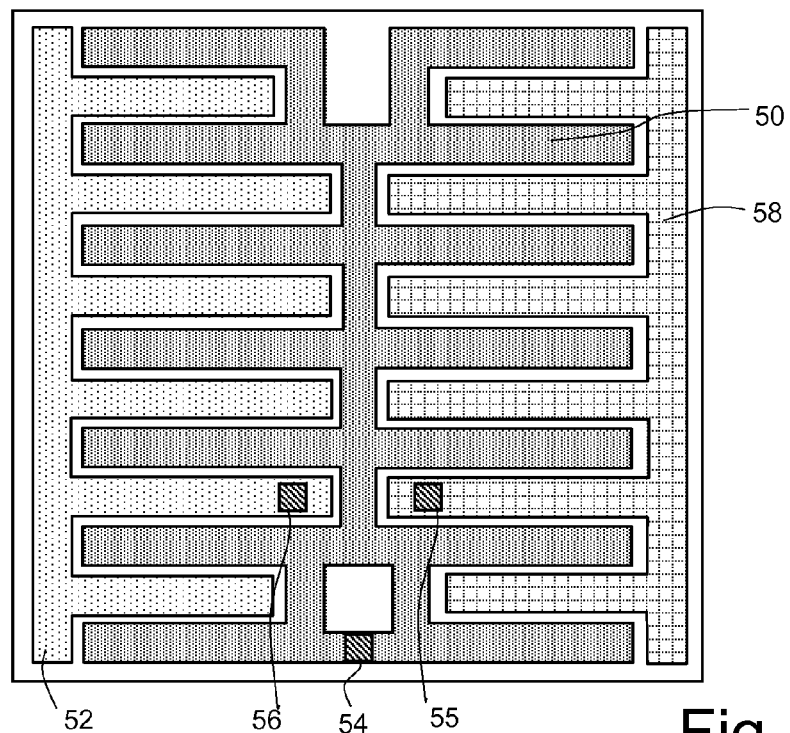
FIGS. 13d and 13e show cross sections of a further embodiment of an electronic device.
Figure 13E:
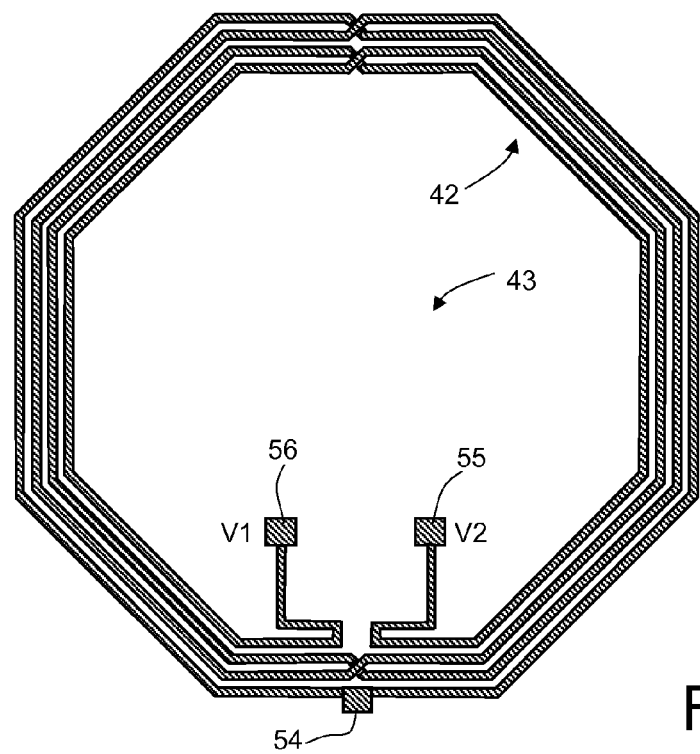
Figure 13F:
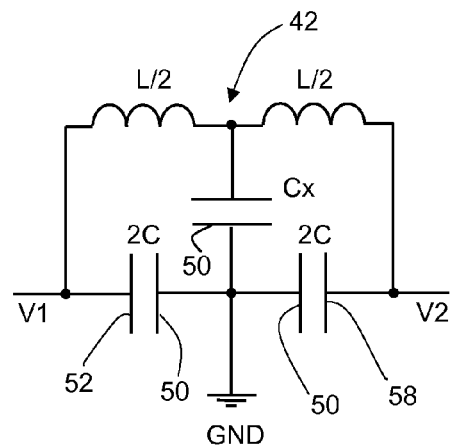
FIG. 13f shows an equivalent electrical circuit of an embodiment of an electronic device.

In practice, the antenna 42 of the embodiments shown in FIGS. 13a, 13b is a differential antenna. Consequently, to optimize operation of the communications device 30, it may be possible to create the antenna 42 in such a way that it has a shape having a high degree of symmetry, as shown for example in FIG. 13e, moreover providing the first, second, and third electrodes 50, 52, 58 in such a way that the electromagnetic shield 36 will also have a high degree of symmetry. In particular, as shown in FIG. 13e, the antenna 42 may be formed on two metallization levels, which may be coupled by metal vias, and hence a portion (not shown) of the antenna 42 may possibly be coplanar with the electromagnetic shield 36, in particular as regards the cross-over points (also generally known as "under-pass points"), in which there occurs cross-over between two different metal turns of the antenna 42. With reference to the antenna 42 shown in FIG. 13e, it may be likewise possible to provide within the internal portion 43 defined by the metal turns 40, an additional electrode (not shown), for example having a shape that is the same as that of the aforementioned second portion 50b illustrated in FIG. 10, and to remove the first metal via 54. The additional electrode is set in a way coplanar with respect to the antenna 42 and may be coupled in a way in itself known to a point of contact of the antenna 42, the point of contact being set, for example, on the outermost metal turn 40 of the antenna 42, in such a way that the antenna 42 is still of a differential type. In this way, an electrical circuit of the type shown in FIG. 13f is obtained, i.e., provided, with respect to what is shown in FIG. 13c, with an additional capacitor Cx formed by the additional electrode and by the first electrode 50.

An embodiment of the communications device 30 may be tested and calibrated in a convenient way. In particular, as is known, the connection between the capacitor C and the antenna 42 means that the communications device 30 may be optimized for transmitting at a certain resonant frequency, which depends upon the inductance L associated with the antenna 42 and upon the capacitance of the capacitor C, i.e., upon the shape and arrangement of the first and second electrodes 50, 52. The resonant frequency may be measured by means of automatic test equipment (ATE) 102 (FIG. 14) coupled to a transmitter card 104, which is provided with a support 105 and a respective test antenna 106 set on the support 105. Operatively, it may be possible to transmit through the test antenna 106a querying signal at a test frequency, and receive a corresponding signal of response from the communications device 30, for example once again by means of the test antenna 106. By repeating the procedure for different values of the test frequency, and detecting, for example, the amplitudes of the corresponding response signals, it is possible to determine the resonant frequency, equal to the value of the test frequency to which, for example, the response signal with maximum amplitude corresponds.

Figure 14:
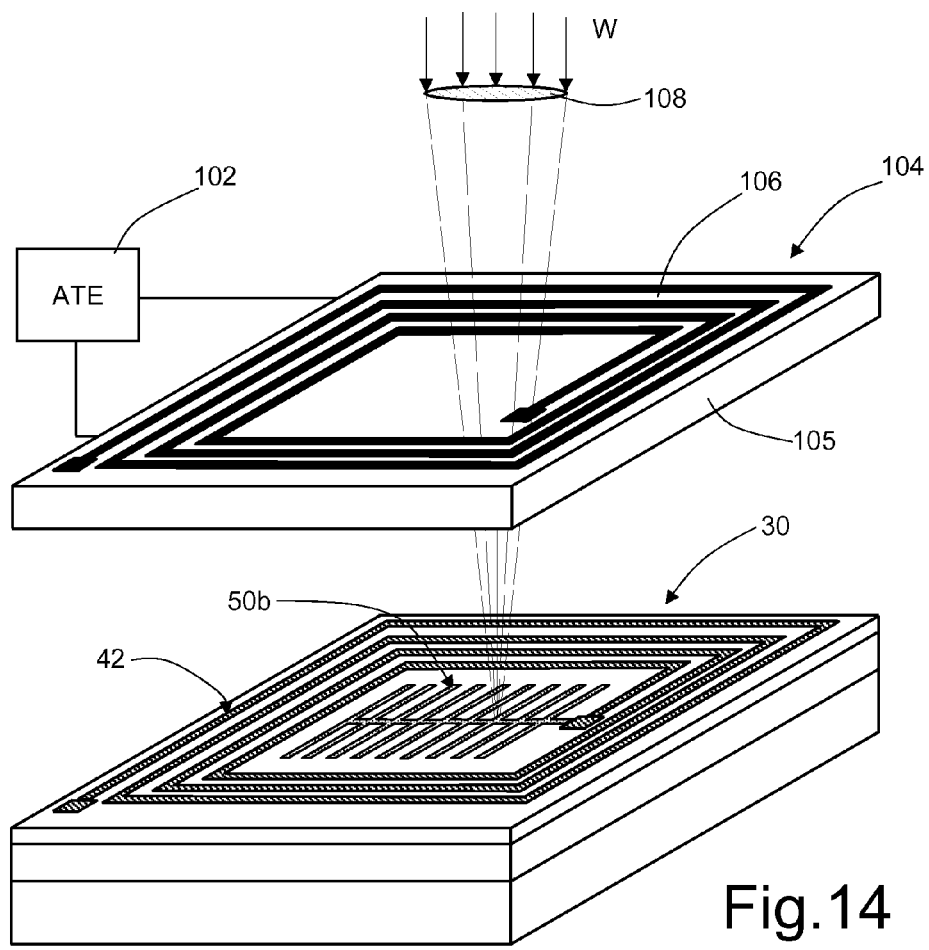
FIG. 14 is a perspective view of an embodiment of an electronic device and of an automatic measurement and calibration system.

As has been mentioned, it may be likewise possible to vary the resonant frequency of the communications device 30, as shown once again in FIG. 14, which illustrates an embodiment in which the second portion 50b of the first electrode 50 is coplanar to the antenna 42. In fact, it may be possible to focus a laser beam W, for example, by means of a lens 108, in such a way that it will cut the geometrical shape of the second portion 50b modifying the geometry (for example, disconnecting a portion), and hence modifying the geometry of the portion 50b of the first electrode 50, with consequent variation of the capacitance of the capacitor C. In this way, also the resonant frequency of the communications device 30 may be varied. In addition, the cutting operation may be performed simultaneously with the aforementioned operations aimed at determining the resonant frequency, for example using a transparent support 105 for the laser beam W, and focusing the laser beam W in such a way that it will traverse the transmitter board 104 before impinging upon the communications device 30. In this way, it may be possible to verify step by step the effect that operations of change of the shape of the second portion 50*b* have on the resonance frequency. Possibly, the support 105 may have an opening through which the laser beam W may pass.

Purely by way of example, if we assume that the second portion 50*b* has the shape shown in FIG. 12, and hence is formed by the aforementioned plurality of conductive elements 100, it may be possible to uncouple ohmically one or more of these conductive elements 100 from the turns 40 of the antenna 42.

In a way altogether similar, it may be possible to act on at least one element from among: the first and second portions 50*a*, 50*b* of the first electrode 50; the second electrode 52; the third electrode 58; and the additional capacitor Cx. For this purpose, it is expedient for these elements to be electromagnetically accessible to the laser beam W. Consequently, the dielectric layer 38 may be at least in part transparent for the laser beam W.

In order to vary the resonance frequency of the communications device 30, it may likewise be possible to cause the laser beam W to impinge on the metal turns 40 of the antenna 42, so as to vary the inductance thereof.

Figure 15:
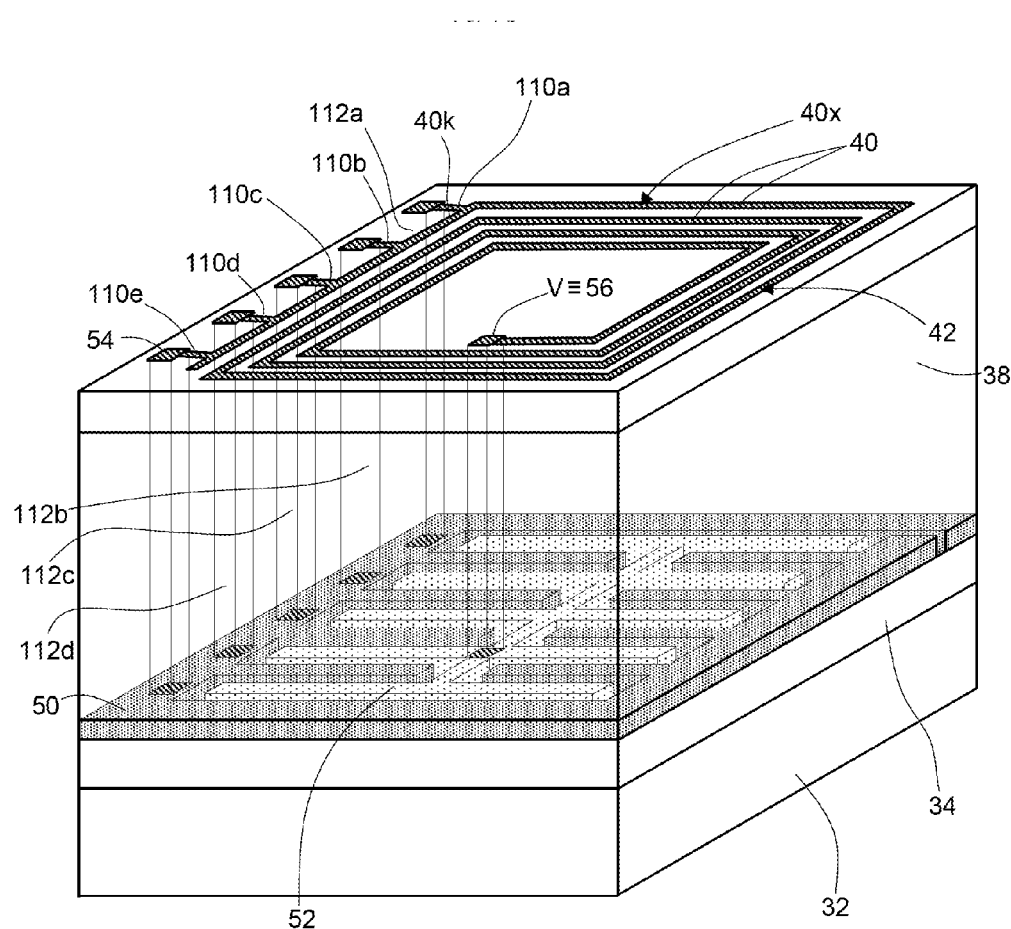
FIG. 15 is a perspective view with portions removed of a further embodiment of an electronic device.

By way of example, FIG. 15 shows an embodiment, in which the outermost turn of the antenna 42, designated by 40 *x*, has a side 40 *k*, departing from which are, in a direction orthogonal to the side 40 *k* itself, a plurality of conductive segments (also known as "stubs"), each of which terminates coupled ohmically up to a corresponding additional via. By way of example, in FIG. 15 a first stub, a second stub, a third stub, a fourth stub, and a fifth stub 110*a*-110 *e* are shown, which depart from corresponding points of the turn 40 *x*, have increasing distances from the innermost point of the metal turns 40 (which is designated by V and coupled to which is, by way of example, the second metal via 56), and are, respectively, coupled to a first additional via, a second additional via, a third additional via, and a fourth additional via 112*a*-112 *d*, and the first metal via 54. As already described for the first metal via 54, also the first, second, third, and fourth additional vias 112*a*-112 *d* are ohmically coupled to the first electrode 50, as shown schematically in FIG. 15. In the case where the first electrode 50 is formed by the first and second portions 50*a*, 50*b* arranged in a noncoplanar way, the first, second, third, and fourth additional vias 112*a*-112 *d* contact the first portion 50*a*, which, as has been said, forms the electromagnetic shield 36.

Given the communications device 30, it may be possible to vary the inductance of the antenna 42 by cutting, with the laser beam W, one or more of the stubs 110*a*-110*d*, starting from the stub 110*a* up to the stub 110*d*, i.e., by ohmically uncoupling one or more from among the first, second, third, and fourth additional vias 112*a*-112 *d*. For example, in the case where the first, second, third, fourth, and fifth stubs 110*a*-110 *e* are all coupled to the side 40*k*, the inductance L of the antenna 42 is proportional to the distance, measured along the metal turns 40, between the point V and the first additional metal via 112*a*. Instead, if the first metal stub 110*a* is uncoupled from the side 40*k*, the inductance L of the antenna 42 increases in so far as it is proportional to the distance, measured along the metal turns 40, between the point V and the second additional metal via 112*b*, and so forth.

Figure 16:
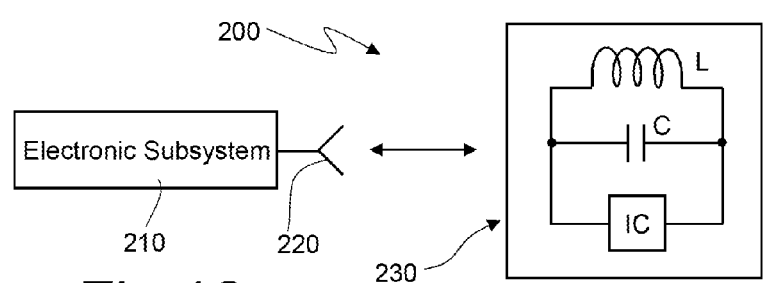
FIG. 16 is a schematic illustration of a communications system comprising an embodiment of an electronic device.

As illustrated in FIG. 16, an embodiment of the present electronic communications device may be integrated in a communications system 200 formed, not only by at least one single electronic communications device, here designated by 230, but also by an electronic subsystem 210 (for example, an RFID reader) coupled to a querying antenna 220, which may transmit and receive data to/from the antenna of the electronic communications device 230. A communications system of this sort may find wide use, for example, in the field of RFID applications or of so-called Smart Cards.

Advantages that one or more embodiments of the above-described communications device affords emerge clearly from the foregoing discussion. In practice, it enables reduction of the encumbrance, integrating at least part of the capacitor coupled to the antenna in the electromagnetic shield, without impairing the capacity of the electromagnetic shield to protect the antenna and the integrated circuit underlying the electromagnetic shield itself by mutual interference.

In addition, one or more embodiments of the present communications device may be calibrated easily, in particular as regards the resonant frequency of the antenna, without any need to resort to probes that ohmically contact the communications device, and hence preventing the risk of damage to the communications device.

Finally, it is clear that modifications and variations may be made to the communications device described and illustrated herein.

In the first place, the first and second electrodes 50, 52 may couple up to the antenna 42 in such a way that the capacitor C is coupled to the antenna 42 not in parallel, but in series.

As regards, instead, the shapes of the first and second electrodes 50, 52 of the capacitor C, the shapes of possible other electrodes, and possibly the shapes of the first and second portions 50*a*, 50*b* of the first electrode 50, they may differ from what has been described and illustrated so far. In addition, one between the first and second electrodes 50, 52 may be coupled to ground.

Again, the first and second electrodes 50, 52, as likewise the antenna 42, may be made either totally or in part of polysilicon or other conductive materials (for example metal), materials having ferromagnetic characteristics, such as for example nickel and corresponding alloys, or cobalt and corresponding alloys. For example, the first electrode 50 and/or the second electrode 52, as well as possible other electrodes, may be formed either totally or in part by a layer of conductive material coated with a layer of ferromagnetic material, or else again they may be made either totally or in part of polysilicon.

In addition, instead of the first and second metal vias 54, 56, it may be possible to resort to vias of any conductive material, not necessarily metal.

As regards, in particular, the antenna 42, it may have a shape different from the ones described. For example, it may comprise two or more ohmically uncoupled conductive elements. Again, it may lie in a number of planes. It is likewise evident that the antenna 42 may be used both for transmitting and for receiving signals.

Finally, the antenna 42 and the electromagnetic shield 36 of one or more embodiments of the present communications device 30 may be provided, in a non-integrated form, on a support/substrate, such as, for example, a printed-circuit board, and be coupled, for example, through conductive bumps to an integrated electronic device set on the support/substrate.

It may likewise be possible for the support/substrate to be coupled to an additional antenna (not shown), for example set specular to the antenna 42 with respect to the electromagnetic shield 36, and hence underneath the electromagnetic shield 36, to which the additional antenna is coupled in a way similar to what has been described as regards the antenna 42.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A system for tuning a resonant circuit comprised of an inductive circuit portion and a capacitive circuit portion of an integrated circuit communications device, comprising:
   a transparent substrate separate from the integrated circuit communications device;
   a test antenna supported by the transparent substrate;
   an automated test equipment circuit coupled to the test antenna and configured to apply a variable signal to said test antenna for communication to said resonant circuit of the separate integrated circuit communications device to identify a resonant frequency of said resonant circuit; and
   a trimming laser configured to emit a laser beam directed through said transparent substrate and towards said separate integrated circuit communications device to effectuate a trimming of a structure of at least one of the inductive circuit portion and the capacitive circuit portion for adjusting the resonant frequency of said resonant circuit.

2. The system of claim 1, wherein said test antenna is formed in a ring shape defining a central open region, and wherein said emitted laser beam passes through said central open region.

3. The system of claim 1, wherein said inductive circuit portion includes one or more stub structures, said trimming laser configured to use said laser beam to sever a selected one or more of the stub structures in adjusting the resonant frequency.

4. The system of claim 1, wherein said capacitive circuit portion includes one or more comb-fingered structures, said trimming laser configured to use said laser beam to sever a selected one or more of the comb-fingered structures in adjusting the resonant frequency.

5. The system of claim 1, wherein said automated test equipment circuit applies the variable signal while the trimming laser emits the laser beam to trim the structure of the inductive circuit portion or capacitive circuit portion to adjust the resonant frequency.

6. A system for tuning a resonant circuit comprised of an inductive circuit portion and a capacitive circuit portion, wherein the capacitive circuit portion comprises a first plate and a second plate that are coplanar with each other and connected to a circuit element and said inductive circuit portion, with no portion of the first plate disposed over any portion of the second plate, comprising:
   a transparent substrate;
   a test antenna supported by the transparent substrate;
   an automated test equipment circuit coupled to the test antenna and configured to apply a variable signal to said test antenna for communication to said resonant circuit to identify a resonant frequency of said resonant circuit; and
   a trimming laser configured to emit a laser beam through said transparent substrate to effectuate a trimming of a structure of at least one of the inductive circuit portion and the capacitive circuit portion for adjusting the resonant frequency.

7. The system of claim 6, wherein the inductive circuit portion comprises an antenna, and wherein the first and second plates are disposed between the circuit element and the antenna.

8. The system of claim 7, wherein the antenna is formed in a ring shape defining a central open region, and wherein said emitted laser beam passes through said central open region.

9. The system of claim 7, wherein an extent of the first and second plates equals or exceeds an extent of the antenna.

10. The system of claim 7, wherein the capacitive circuit portion comprises a third plate coplanar with antenna of the inductive circuit portion.

11. The system of claim 10, wherein the antenna is formed in a ring shape defining a central open region, and wherein said third plate is provided in said central open region.

12. The system of claim 11, said trimming laser configured to use said laser beam on a structure of the third plate in adjusting the resonant frequency.

13. A method, comprising:
   energizing a resonant circuit comprised of an inductive circuit portion and a capacitive circuit portion of an integrated circuit communications device;
   identifying a resonant frequency of said resonant circuit from said energizing; and
   emitting a laser beam to effectuate a trimming of a structure of at least one of the inductive circuit portion and the capacitive circuit portion for adjusting the resonant frequency;
   wherein energizing comprises applying a varying signal to a test antenna supported by a transparent substrate that is separate from the integrated circuit communications device but positioned in proximity to said resonant circuit.

14. The method of claim 13, wherein emitting comprises emitting the laser beam to pass through the transparent substrate supporting the test antenna.

15. The method of claim 14, wherein the test antenna is formed in a ring shape defining a central open region, and wherein emitting further comprises emitting the laser beam to pass through the central open region.

16. The method of claim 13, wherein applying a varying signal and emitting the laser beam occur at a same time.

17. The method of claim 13, wherein said inductive circuit portion includes one or more stub structures, and wherein emitting comprises using said laser beam to sever a selected one or more of the stub structures in adjusting the resonant frequency.

18. The method of claim 13, wherein said capacitive circuit portion includes one or more comb-fingered structures, and wherein emitting comprises using said laser beam to sever a selected one or more of the comb-fingered structures in adjusting the resonant frequency.

19. The system of claim 6, wherein said test antenna is formed in a ring shape defining a central open region, and wherein said emitted laser beam passes through said central open region.

20. The system of claim 6, wherein said inductive circuit portion includes one or more stub structures, said trimming laser configured to use said laser beam to sever a selected one or more of the stub structures in adjusting the resonant frequency.

21. The system of claim 6, wherein said capacitive circuit portion includes one or more comb-fingered structures, said trimming laser configured to use said laser beam to sever a selected one or more of the comb-fingered structures in adjusting the resonant frequency.

22. The system of claim 6, wherein said automated test equipment circuit applies the variable signal while the trimming laser emits the laser beam to trim the structure of the inductive circuit portion or capacitive circuit portion to adjust the resonant frequency.

\* \* \* \* \*